US012559381B2

(12) United States Patent
    Kim et al.

(10) Patent No.: US 12,559,381 B2
(45) Date of Patent: Feb. 24, 2026

(54) SINTERED BODY, METHOD OF FABRICATING THE SAME, SEMICONDUCTOR FABRICATING DEVICE, AND METHOD OF FABRICATING SEMICONDUCTOR FABRICATING DEVICE

(71) Applicant: SAMSUNG ELECTRONICS CO., LTD., Suwon-si (KR)

(72) Inventors: Chang Hwan Kim, Suwon-si (KR); Takafumi Noguchi, Yokohama (JP); Toshihiro Iizuka, Yokohama (JP); Kenichi Nagayama, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 979 days.

(21) Appl. No.: 17/528,682

(22) Filed: Nov. 17, 2021

(65) Prior Publication Data

US 2022/0162083 A1     May 26, 2022

(30) Foreign Application Priority Data

Nov. 25, 2020     (JP) ................................. 2020-194856

(51) Int. Cl.
| | |
|---|---|
| *B28B 1/26* | (2006.01) |
| *B28B 3/02* | (2006.01) |
| *B28B 11/24* | (2006.01) |
| *C01F 17/259* | (2020.01) |
| *H01J 37/32* | (2006.01) |

(52) U.S. Cl.
CPC .............. *C01F 17/259* (2020.01); *B28B 1/26* (2013.01); *B28B 3/02* (2013.01); *B28B 11/243* (2013.01); *H01J 37/32495* (2013.01); *C01P 2006/62* (2013.01); *C01P 2006/80* (2013.01); *C01P 2006/90* (2013.01)

(58) Field of Classification Search
CPC ............ B28B 1/26; B28B 3/02; B28B 11/243
USPC ........................................................ 264/674
See application file for complete search history.

(56) References Cited

U.S. PATENT DOCUMENTS

| | | | |
|---|---|---|---|
| 2019/0345069 A1* | 11/2019 | Kajino .................. | C01F 17/259 |
| 2020/0095687 A1* | 3/2020 | Park ........................ | C23C 4/137 |

FOREIGN PATENT DOCUMENTS

| | | |
|---|---|---|
| JP | 2000-239067 A | 9/2000 |
| JP | 2016-098143 A | 5/2016 |
| JP | 2016153369 A | 8/2016 |
| JP | WO 2016/104354 A1 | 4/2017 |
| JP | WO 2018/052128 A1 | 3/2018 |
| JP | 2018-190985 A | 11/2018 |

(Continued)

OTHER PUBLICATIONS

English translation of JP2019069876 (Year: 2019).*

(Continued)

*Primary Examiner* — Christina A Johnson
*Assistant Examiner* — Xue H Liu
(74) *Attorney, Agent, or Firm* — Muir Patent Law, PLLC

(57)     ABSTRACT

A sintered body, a method of fabricating the sintered body, a semiconductor fabricating device, and a method of fabricating the semiconductor fabricating device, the sintered body including 50 mass % or more of $Y_5O_4F_7$, wherein the sintered body has a relative density of 97.0% or more and a Vickers hardness of 2.4 GPa or more.

12 Claims, 18 Drawing Sheets

(56) References Cited

FOREIGN PATENT DOCUMENTS

| | | | |
|---|---|---|---|
| JP | WO 2018/159713 | A1 | 3/2019 |
| JP | 2019069876 | A | 5/2019 |
| JP | 2020525640 | A | 8/2020 |
| KR | 10-2017-0036802 | A | 4/2017 |
| WO | 2018116688 | A | 10/2019 |
| WO | 2020179296 | A | 9/2020 |

OTHER PUBLICATIONS

English translation of JP2016153669 (Year: 2016).*
English translation of WO2020/179296 (Year: 2020).*
English translation of WO2018/0521285 (Year: 2018).*
Decision to Grant in corresponding application JP 2020-194856, dated Oct. 1, 2024.
"Fabrication of dense yttrium oxyfluoride ceramics by hot pressing and their mechanical, thermal, and electrical properties", Japanese Journal of Applied Physics 57, 06JF04 (2018).
"Fluorine and oxygen plasma exposure behavior of yttrium oxyfluoride ceramics", Japanese Journal of Applied Physics 58, SEEC01 (2019).
"Development of low dust generation member with excellent plasma resistance", Ceramics 50 (2015) No. 6490-491.
"Example of color tolerance", [online], Nippon Denshoku Kogyo Co., Ltd., [Searched on Nov. 4, 2020], Internet <https://www.nippondenshoku.co.jp/web/japanese/colorstory/08_allowance_by_color.htm>.
"Influence of Rare Earth Additive on Transparency of a-SiAION Ceramics", Preliminary Collection of Lectures for the 33rd Fall Symposium (Lecture No. 2F27).

* cited by examiner

FIG. 3

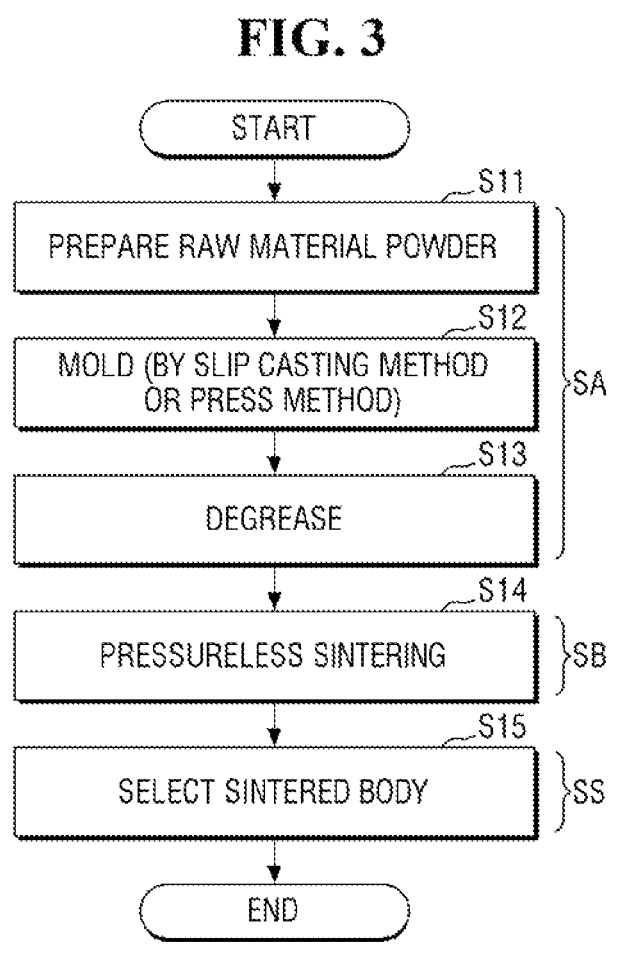

```
        ┌──────────────┐
        │    START     │
        └──────────────┘
                │
                ▼                      ⌐S11
   ┌─────────────────────────────┐  ┐
   │  PREPARE RAW MATERIAL POWDER │  │
   └─────────────────────────────┘  │
                │                    │
                ▼              ⌐S12  │
   ┌─────────────────────────────┐  │
   │  MOLD (BY SLIP CASTING METHOD│  │ SA
   │     OR PRESS METHOD)         │  │
   └─────────────────────────────┘  │
                │                    │
                ▼              ⌐S13  │
   ┌─────────────────────────────┐  │
   │         DEGREASE            │  │
   └─────────────────────────────┘  ┘
                │
                ▼              ⌐S14
   ┌─────────────────────────────┐ ┐
   │    PRESSURELESS SINTERING    │ │ SB
   └─────────────────────────────┘ ┘
                │
                ▼              ⌐S15
   ┌─────────────────────────────┐ ┐
   │     SELECT SINTERED BODY     │ │ SS
   └─────────────────────────────┘ ┘
                │
                ▼
        ┌──────────────┐
        │     END      │
        └──────────────┘
```

FIG. 7A

| Example | Fabricating Condition | | | | | | | | Evaluation Result | | |
|---|---|---|---|---|---|---|---|---|---|---|---|
| | Molding | | | Sintering | | | | Overall Judgment | Relative Density (%) | Hardness (GPa) | L* |
| | Raw Material Powder | Molding Method | Cip | Atmosphere | Temperature Increase Rate (°C/h) | Holding Temperature (°C) | Holding Time (h) | | | | |
| Comparative Example 1 | A | Slip Cast | Present | Ar | 1000 | 900 | 1 | × | 79.2 | 2.8 | 91.53 |
| Example 1 | A | Slip Cast | Present | Ar | 1000 | 1000 | 1 | ◎ | 97.2 | 3.9 | 81.31 |
| Comparative Example 2 | A | Slip Cast | Present | Ar | 1000 | 1100 | 1 | × | 95.6 | 4 | 81.9 |
| Comparative Example 3 | C | Slip Cast | Present | Ar | 1000 | 900 | 1 | × | 91.6 | 4.7 | 92.37 |
| Example 2 | C | Slip Cast | Present | Ar | 1000 | 1000 | 1 | ◎ | 97.8 | 4.2 | 72.26 |
| Example 3 | C | Slip Cast | Present | Ar | 1000 | 1100 | 1 | ◎ | 97.7 | 3.6 | 79.33 |
| Comparative Example 4 | A | Press | Present | Ar | 1000 | 900 | 1 | × | 91.3 | 3.3 | 93.72 |
| Example 4 | A | Press | Present | Ar | 1000 | 1000 | 1 | ◎ | 97.7 | 4.3 | 79.98 |
| Example 5 | A | Press | Present | Ar | 1000 | 1100 | 1 | ◎ | 97.8 | 4.4 | 76.41 |
| Comparative Example 5 | C | Press | Not Present | Ar | 1000 | 900 | 1 | × | 74.5 | NA | 97.51 |
| Comparative Example 6 | C | Press | Not Present | Ar | 1000 | 1000 | 1 | × | 94.9 | NA | 88.93 |
| Comparative Example 7 | C | Press | Not Present | Ar | 1000 | 1100 | 1 | × | 94.3 | NA | 85.9 |
| Comparative Example 8 | C | Press | Present | Ar | 1000 | 900 | 1 | × | 78.6 | 2.8 | 93.58 |

FIG. 7B

| Example | Fabricating Condition | | | | | | | | Evaluation Result | | |
| --- | --- | --- | --- | --- | --- | --- | --- | --- | --- | --- | --- |
| | Molding | | | Sintering | | | | Overall Judgment | Relative Density (%) | Hardness (GPa) | L* |
| | Raw Material Powder | Molding Method | Cip | Atmosphere | Temperature Increase Rate (°C/h) | Holding Temperature (°C) | Holding Time (h) | | | | |
| Comparative Example 9 | C | Press | Present | Ar | 1000 | 1000 | 1 | × | 96.1 | 4 | 86.99 |
| Comparative Example 10 | C | Press | Present | Ar | 1000 | 1100 | 1 | × | 94.8 | 3.6 | 86.1 |
| Comparative Example 11 | A | SLIP CAST | Present | Vacuum | 1000 | 900 | 1 | × | 96.8 | 3.8 | 73.33 |
| Example 6 | A | Slip Cast | Present | Vacuum | 1000 | 1000 | 1 | ○ | 99.3 | 3.3 | 61 |
| Example 7 | A | Slip Cast | Present | Vacuum | 1000 | 1100 | 1 | ○ | 99.2 | 3 | 50.81 |
| Comparative Example 12 | C | Slip Cast | Present | Vacuum | 1000 | 900 | 1 | × | 88.6 | 3.3 | 80.38 |
| Example 8 | C | Slip Cast | Present | Vacuum | 1000 | 1000 | 1 | ◎ | 98.5 | 3.2 | 70.87 |
| Example 9 | C | Slip Cast | Present | Vacuum | 1000 | 1100 | 1 | ○ | 98.7 | 3.3 | 52.55 |
| Comparative Example 13 | A | Press | Present | Vacuum | 1000 | 900 | 1 | × | 95.4 | 4.2 | 76.16 |
| Example 10 | A | Press | Present | Vacuum | 1000 | 1000 | 1 | ○ | 99.1 | 3.1 | 64.47 |
| Example 11 | A | Press | Present | Vacuum | 1000 | 1100 | 1 | ○ | 99.1 | 3.7 | 54.26 |
| Comparative Example 14 | C | Press | Present | Vacuum | 1000 | 900 | 1 | × | 84.8 | 3.3 | 92.49 |
| Example 12 | C | Press | Present | Vacuum | 1000 | 1000 | 1 | ◎ | 97 | 3 | 81.04 |
| Example 13 | C | Press | Present | Vacuum | 1000 | 1100 | 1 | ◎ | 97.9 | 3.7 | 76.4 |
| Comparative Example 15 | A | Press | Present | Vacuum | 1000 | 900 | 1 | × | 68.5 | NA | 98.97 |
| Comparative Example 16 | A | Press | Present | Vacuum | 1000 | 1000 | 1 | × | 84.9 | NA | 93.72 |
| Comparative Example 17 | A | Press | Present | Vacuum | 1000 | 1100 | 1 | × | 94.3 | NA | 96.54 |

| Example | Fabricating Condition | | | | Evaluation Result | | | |
| --- | --- | --- | --- | --- | --- | --- | --- | --- |
| | Raw Material Powder | Atmos-phere | Holding Temperature (°C) | Holding Time (h) | Overall Judgment | Relative Density (%) | Hardness (GPa) | L* |
| Example 14 | A | Ar | 1000 | 1 | ○ | 100 | 2.4 | 40.32 |
| Example 15 | C | Ar | 1000 | 1 | ○ | 100 | 4.2 | 46.42 |
| Example 16 | A | Ar | 1400 | 0 | ○ | 100 | 2.9 | 42.9 |
| Example 17 | C | Ar | 1400 | 0 | ○ | 100 | 3 | 50.18 |
| Example 18 | A | Ar | 1000 | 0 | ○ | 99.6 | 4 | 50.82 |
| Comparative Example 18 | C | Ar | 1000 | 0 | × | 95.7 | 3.9 | 75.13 |
| Comparative Example 19 | A | Ar | 900 | 0 | × | 87.9 | 2.9 | 77.23 |
| Comparative Example 20 | C | Ar | 900 | 0 | × | 65.2 | 1.1 | 90.51 |
| Example 19 | A | Ar | 1200 | 0 | ○ | 100 | 2.9 | 41.43 |
| Example 20 | C | Ar | 1200 | 0 | ○ | 99.9 | 3 | 48.86 |
| Example 21 | A | Vacuum | 1000 | 0 | ○ | 99.9 | 4.6 | 38.92 |
| Comparative Example 21 | C | Vacuum | 1000 | 0 | × | 96.5 | 4 | 57.41 |
| Example 22 | A | Ar | 900 | 1 | ○ | 99.1 | 3.8 | 63.78 |
| Comparative Example 22 | C | Ar | 900 | 1 | × | 93.1 | 3.2 | 78.54 |
| Comparative Example 23 | A | Ar | 950 | 0 | × | 88.7 | 3.2 | 76.42 |
| Comparative Example 24 | C | Ar | 950 | 0 | × | 68.4 | 1 | 90.03 |
| Example 23 | A | Ar | 1100 | 0 | ○ | 100 | 2.4 | 37.27 |
| Example 24 | C | Ar | 1100 | 0 | ○ | 100 | 2.6 | 43.66 |
| Comparative Example 25 | A | Vacuum | 900 | 0 | × | 91.3 | 3.8 | 78.04 |
| Comparative Example 26 | C | Vacuum | 900 | 0 | × | 75 | 1.7 | 87.04 |
| Comparative Example 27 | A | Vacuum | 1400 | 0 | × | 100 | 2 | 36.32 |
| Comparative Example 28 | C | Vacuum | 1400 | 0 | × | 100 | 2.1 | 40.6 |

| Example | Sintered Body Before Hip Processing | | | | Hip Condition | | Evaluation Result After Hip Processing | | | |
|---|---|---|---|---|---|---|---|---|---|---|
| | Fabricating Condition | Overall Judgment | Relative Density (%) | L* | Holding Temperature (°C) | Holding Time (h) | Overall Judgment | Relative Density (%) | Hardness (GPa) | L* |
| Comparative Example 29 | Comparative Example 1 | J× | 79.2 | 91.53 | 1000 | 3 | × | 88.2 | 2.8 | 90.5 |
| Example 25 | Example 1 | J◎ | 97.2 | 81.31 | 1100 | 3 | ◎ | 99.5 | 2.9 | 67.27 |
| Example 26 | Comparative Example 3 | J○ | 91.6 | 92.37 | 1000 | 3 | ○ | 99.4 | 3 | 44.49 |
| Example 27 | Example 2 | ● | 97.8 | 72.26 | 1100 | 3 | ○ | 99.5 | 3.6 | 43.8 |
| Example 28 | Comparative Example 4 | J○ | 91.3 | 93.72 | 1000 | 3 | ○ | 98.8 | 2.9 | 45.91 |
| Comparative Example 30 | Comparative Example 5 | J× | 74.5 | 97.51 | 1000 | 3 | × | 87.3 | 2.8 | 96.76 |
| Example 29 | Comparative Example 6 | J◎ | 94.9 | 88.93 | 1100 | 3 | ◎ | 99.2 | 2.9 | 78.21 |
| Comparative Example 31 | Comparative Example 8 | J× | 78.6 | 93.58 | 1000 | 3 | × | 87.5 | 2.3 | 95.06 |
| Example 30 | Comparative Example 9 | J◎ | 96.1 | 88.99 | 1100 | 3 | ◎ | 99.4 | 3.4 | 81.86 |
| Comparative Example 32 | Comparative Example 12 | J× | 88.6 | 80.38 | 1100 | 0 | × | 92 | 3 | 70.96 |
| Comparative Example 33 | Comparative Example 14 | J× | 84.8 | 92.49 | 1100 | 0 | × | 88.5 | 3.3 | 95.35 |
| Comparative Example 34 | Comparative Example 14 | J× | 84.8 | 92.49 | 1100 | 1 | × | 87.7 | NA | 90. |
| Example 31 | Example 12 | J◎ | 97 | 81.04 | 1100 | 0 | ◎ | 99.2 | 3.3 | 70.87 |
| Example 32 | Example 12 | J◎ | 97 | 81.04 | 1100 | 1 | ◎ | 99.6 | 3.3 | 67.46 |
| Example 33 | Example 13 | J◎ | 97.9 | 76.4 | 1100 | 0 | ◎ | 99.4 | 3.2 | 67.97 |
| Comparative Example 35 | Comparative Example 16 | J× | 84.9 | 93.72 | 1100 | 0 | × | 83.8 | 3.3 | 98.83 |
| Example 34 | Comparative Example 17 | J◎ | 94.3 | 96.54 | 1100 | 1 | ◎ | 99.4 | 3.2 | 74.85 |

FIG. 13A

| Example | Fabricating Condition | | | | | | | Evaluation Result | | | |
| --- | --- | --- | --- | --- | --- | --- | --- | --- | --- | --- | --- |
| | Molding | | | Sintering | | | | Overall Judgment | Relative Density (%) | Hardness (GPa) | L* |
| | Raw Material Powder | Molding Method | Cip | Atmosphere | Temperature Increase Rate (°C/h) | Holding Temperature (°C) | Holding Time (h) | | | | |
| Comparative Example 1 | A | Slip Cast | Present | Ar | 1000 | 900 | 1 | ×(J) | 79.2 | 2.8 | 91.53 |
| Example 1 | A | Slip Cast | Present | Ar | 1000 | 1000 | 1 | ◎ | 97.2 | 3.9 | 81.31 |
| Comparative Example 2 | A | Slip Cast | Present | Ar | 1000 | 1100 | 1 | ◎ | 95.6 | 4 | 81.9 |
| Comparative Example 3 | C | Slip Cast | Present | Ar | 1000 | 900 | 1 | ○ | 91.6 | 4.7 | 92.37 |
| Example 2 | C | Slip Cast | Present | Ar | 1000 | 1000 | 1 | ● | 97.8 | 4.2 | 72.26 |
| Example 3 | C | Slip Cast | Present | Ar | 1000 | 1100 | 1 | ◎ | 97.7 | 3.6 | 79.33 |
| Comparative Example 4 | A | Press | Present | Ar | 1000 | 900 | 1 | ○ | 91.3 | 3.3 | 93.72 |
| Example 4 | A | Press | Present | Ar | 1000 | 1000 | 1 | ◎ | 97.7 | 4.3 | 79.98 |
| Example 5 | A | Press | Present | Ar | 1000 | 1100 | 1 | ◎ | 97.8 | 4.4 | 76.41 |
| Comparative Example 5 | C | Press | Not Present | Ar | 1000 | 900 | 1 | ×(J) | 74.5 | NA | 97.51 |
| Comparative Example 6 | C | Press | Not Present | Ar | 1000 | 1000 | 1 | ◎ | 94.9 | NA | 88.93 |
| Comparative Example 7 | C | Press | Not Present | Ar | 1000 | 1100 | 1 | ◎ | 94.3 | NA | 85.9 |
| Comparative Example 8 | C | Press | Present | Ar | 1000 | 900 | 1 | ×(J) | 78.6 | 2.8 | 93.58 |

FIG. 13B

| Example | Fabricating Condition | | | | | | | Evaluation Result | | | |
|---|---|---|---|---|---|---|---|---|---|---|---|
| | Molding | | | Sintering | | | | | | | |
| | Raw Material Powder | Molding Method | Cip | Atmosphere | Temperature increase Rate(°C/h) | Holding Temperature (°C) | Holding Time (h) | Overall Judgment | Relative Density (%) | Hardness (GPa) | L* |
| Comparative Example 9 | C | Press | Present | Ar | 1000 | 1000 | 1 | ◎ | 96.1 | 4 | 88.99 |
| Comparative Example 10 | C | Press | Present | Ar | 1000 | 1100 | 1 | ◎ | 94.8 | 3.6 | 86.1 |
| Comparative Example 11 | A | Slip Cast | Present | Vacuum | 1000 | 900 | 1 | × | 96.8 | 3.8 | 73.33 |
| Example 6 | A | Slip Cast | Present | Vacuum | 1000 | 1000 | 1 | ○ | 99.3 | 3.3 | 61 |
| Example 7 | A | Slip Cast | Present | Vacuum | 1000 | 1100 | 1 | ○ | 99.2 | 3 | 50.81 |
| Comparative Example 12 | C | Slip Cast | Present | Vacuum | 1000 | 900 | 1 | ◎ ● | 88.6 | 3.3 | 80.38 |
| Example 8 | C | Slip Cast | Present | Vacuum | 1000 | 1000 | 1 | ◎ ● | 98.5 | 3.2 | 70.87 |
| Example 9 | C | Slip Cast | Present | Vacuum | 1000 | 1100 | 1 | ◎ ● | 98.7 | 3.3 | 52.55 |
| Comparative Example 13 | A | Press | Present | Vacuum | 1000 | 900 | 1 | ◎ | 95.4 | 4.2 | 76.16 |
| Example 10 | A | Press | Present | Vacuum | 1000 | 1000 | 1 | ○ | 99.1 | 3.1 | 64.47 |
| Example 11 | A | Press | Present | Vacuum | 1000 | 1100 | 1 | ○ | 99.1 | 3.7 | 54.26 |
| Comparative Example 14 | C | Press | Present | Vacuum | 1000 | 900 | 1 | × | 84.8 | 3.3 | 92.49 |
| Example 12 | C | Press | Present | Vacuum | 1000 | 1000 | 1 | ◎ | 96.8 | 3 | 83.9 |
| Example 13 | C | Press | Present | Vacuum | 1000 | 1100 | 1 | ◎ | 97.9 | 3.7 | 76.4 |
| Comparative Example 15 | B | Press | Present | Vacuum | 1000 | 900 | 1 | × | 68.5 | NA | 98.97 |
| Comparative Example 16 | B | Press | Present | Vacuum | 1000 | 1000 | 1 | × | 84.9 | NA | 93.72 |
| Comparative Example 17 | B | Press | Present | Vacuum | 1000 | 1100 | 1 | ◎ | 94.3 | NA | 96.54 |

FIG. 14

| Example | Fabricating Condition | | | | Evaluation Result | | | |
|---|---|---|---|---|---|---|---|---|
| | Raw Material Powder | Atmos-phere | Holding Temperature (°C) | Holding Time (h) | Overall Judgment | Relative Density (%) | Hardness (GPa) | L* |
| Example 14 | A | Ar | 1000 | 1 | J● | 100 | 2.4 | 40.32 |
| Example 15 | C | Ar | 1000 | 1 | J● | 100 | 4.2 | 46.42 |
| Example 16 | A | Ar | 1400 | 0 | J● | 100 | 2.9 | 42.9 |
| Example 17 | C | Ar | 1400 | 0 | J● | 100 | 3 | 50.18 |
| Example 18 | A | Ar | 1000 | 0 | J● | 99.6 | 4 | 50.82 |
| Comparative Example 18 | C | Ar | 1000 | 0 | J◎ | 95.7 | 3.9 | 75.13 |
| Comparative Example 19 | A | Ar | 900 | 0 | J× | 87.9 | 2.9 | 77.23 |
| Comparative Example 20 | C | Ar | 900 | 0 | J× | 65.2 | 1.1 | 90.51 |
| Example 19 | A | Ar | 1200 | 0 | J● | 100 | 2.9 | 41.43 |
| Example 20 | C | Ar | 1200 | 0 | J● | 99.9 | 3 | 48.86 |
| Example 21 | A | Vacuum | 1000 | 0 | J● | 99.9 | 4.6 | 38.92 |
| Comparative Example 21 | C | Vacuum | 1000 | 0 | J● | 96.5 | 4 | 57.41 |
| Example 22 | A | Ar | 900 | 1 | J● | 99.1 | 3.8 | 63.78 |
| Comparative Example 22 | C | Ar | 900 | 1 | J○ | 93.1 | 3.2 | 78.54 |
| Comparative Example 23 | A | Ar | 950 | 0 | J× | 88.7 | 3.2 | 76.42 |
| Comparative Example 24 | C | Ar | 950 | 0 | J× | 68.4 | 1 | 90.03 |
| Example 23 | A | Ar | 1100 | 0 | J● | 100 | 2.4 | 37.27 |
| Example 24 | C | Ar | 1100 | 0 | J● | 100 | 2.6 | 43.66 |
| Comparative Example 25 | A | Vacuum | 900 | 0 | J○ | 91.3 | 3.8 | 78.04 |
| Comparative Example 26 | C | Vacuum | 900 | 0 | J× | 75 | 1.7 | 87.04 |
| Comparative Example 27 | A | Vacuum | 1400 | 0 | J● | 100 | 2 | 36.32 |
| Comparative Example 28 | C | Vacuum | 1400 | 0 | J● | 100 | 2.1 | 40.6 |

FIG. 15

| Example | Sintered Body Before Hip Processing | | | Plasma Resistance Evaluation Result | |
| --- | --- | --- | --- | --- | --- |
| | Relative Density (%) | Hardness (GPa) | L* | Etching Amount (μm) | Ra Deterioration Rate |
| Example 1 | 97.2 | 3.9 | 81.31 | 0.403 | 1.55 |
| Example 23 | 100 | 2.4 | 37.27 | 0.44 | 1.66 |
| Example 34 | 99.4 | 3.2 | 74.85 | 0.457 | 1.14 |
| Comparative Example 18 | 95.7 | 3.9 | 75.13 | 0.479 | 2.11 |
| Comparative Example 27 | 100 | 2 | 36.32 | 0.512 | 2.68 |
| Comparative Example 36 ($Y_2O_3$) | >99 | 6 | NA | 0.455 | 2.17 |

SINTERED BODY, METHOD OF FABRICATING THE SAME, SEMICONDUCTOR FABRICATING DEVICE, AND METHOD OF FABRICATING SEMICONDUCTOR FABRICATING DEVICE

CROSS-REFERENCE TO RELATED APPLICATION

This application claims priority from Japanese Patent Application No. 2020-194856 filed on Nov. 25, 2020 in the Japan Patent Office, the disclosure of which is incorporated herein by reference in its entirety.

BACKGROUND

1. Field

Embodiments relate to a sintered body, a method of fabricating the sintered body, a semiconductor fabricating device, and a method of fabricating the semiconductor fabricating device.

2. Description of the Related Art

Due to miniaturization of a semiconductor, a fabricating process with low contamination has been considered.

SUMMARY

The embodiments may be realized by providing a sintered body including 50 mass % or more of $Y_5O_4F_7$, wherein the sintered body has a relative density of 97.0% or more and a Vickers hardness of 2.4 GPa or more.

The embodiments may be realized by providing a method of fabricating a sintered body, the method including molding a molded body including a $Y_5O_4F_7$ powder; forming a composite sintered body by sintering the molded body at a temperature of 1,000° C. or higher under an argon gas atmosphere or a vacuum atmosphere of $10^{-3}$ Pa or less; and selecting a desired sintered body from the composite sintered body such that the desired sintered body includes 50 mass % or more of $Y_5O_4F_7$, has a relative density of 97.0% or more, and has a Vickers hardness of 2.4 GPa or more.

The embodiments may be realized by providing a sintered body prepared according to the method according to an embodiment.

The embodiments may be realized by providing a semiconductor fabricating device including the sintered body according to an embodiment.

BRIEF DESCRIPTION OF THE DRAWINGS

Features will be apparent to those of skill in the art by describing in detail exemplary embodiments with reference to the attached drawings in which:

FIG. 3 is a flow chart of a method of fabricating the sintered body using a pressureless sintering method according to the first embodiment.

FIGS. 7A and 7B are tables of an evaluation result of the sintered body by the pressureless sintering method according to the first embodiment;

FIG. 8 is an X-ray diffraction (XRD) analysis result of the sintered body by the pressureless sintering method according to the first embodiment;

FIG. 9 is a graph of an evaluation result of the sintered body by the hot press method according to the first embodiment;

FIG. 10 is an XRD analysis result of the sintered body by the hot press method according to the first embodiment;

FIG. 11 is a table of an evaluation result of a sintered body obtained by further performing hot isostatic pressing (HIP) processing on the sintered body by the pressureless sintering method according to the first embodiment;

FIGS. 13A and 13B are tables of an evaluation result with a changed determination criterion in the sintered body by the pressureless sintering method according to the first embodiment;

FIG. 14 is a table of an evaluation result with a changed determination criterion in the sintered body by the hot press method according to the first embodiment;

FIG. 15 is a table of fabricating conditions and a plasma resistance test result of the sintered body according to the first embodiment;

DETAILED DESCRIPTION

Figure 1:
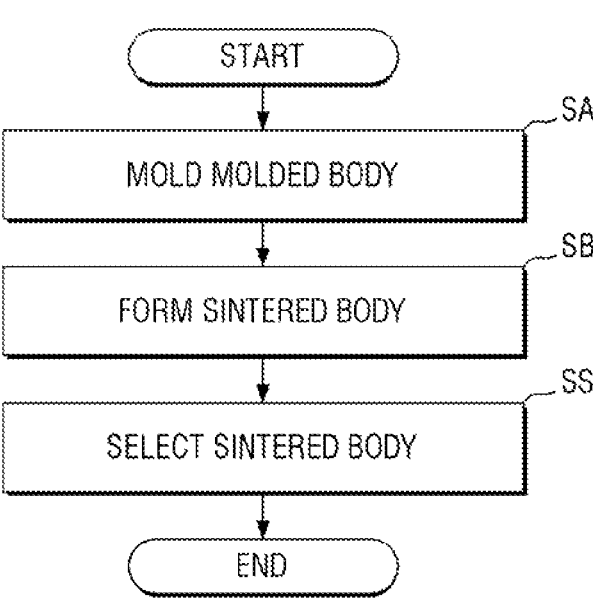
FIG. 1 is a flow chart of a method of fabricating a sintered body according to a first embodiment.

Hereinafter, a sintered body and a method of fabricating the sintered body according to a first embodiment will be described. First, <an outline of the sintered body> will be described. Further, <a method of fabricating the sintered body> will be described. Then, <a method of evaluating the sintered body> and <an evaluation result> will be described.

<Outline of Sintered Body>

A sintered body of $Y_5O_4F_7$ may have a high density and a high hardness. In an implementation, the acquired sintered body may include, e.g., 50 mass % or more of $Y_5O_4F_7$, a relative density may be, e.g., 97.0% or more, and a Vickers hardness may be, e.g., 2.4 GPa or more. In an implementation, the sintered body may have a high relative density and thus corrosion resistance may be improved. In an implementation, the $Y_5O_4F_7$ sintered body has a relative density of 99.0% or more. In an implementation, corrosion resistance against a halogen gas may be improved. In an implementation, the $Y_5O_4F_7$ sintered body may be a next-generation corrosion-resistant material, e.g., instead of $Y_2O_3$. In an implementation, the sintered body may have a high Vickers hardness, e.g., of the same order as $Y_2O_3$. In an implementation, the sintered body may have the high hardness, and plasma resistance may be improved. In an implementation, the $Y_5O_4F_7$ sintered body may include 99 mass % or more of $Y_5O_4F_7$ as a main phase, and quality may be improved.

An acquired sintered body may be discolored black when $Y_5O_4F_7$ is sintered at a high temperature to increase density. A cause of the discoloration may be loss of oxygen (O) or fluorine (F) due to the high temperature, or diffusion and aggregation of carbon. When a color of a member in the chamber in a semiconductor fabricating device is black, black contamination by abnormal discharge and the like in the chamber may be difficult to observe with the naked eye, and abnormality detection may be missed. Further, defects such as a case in which determining an opportunity for chamber cleaning is hindered and the like could occur. In an implementation, the member in the chamber may be white so that contamination may be easily recognized or observed.

As a result of precisely reviewing fabricating conditions, a high density and the high hardness sintered body of $Y_5O_4F_7$ without black discoloration may be formed. In an implementation, in the $Y_5O_4F_7$ sintered body, a whiteness L* in a Lab color space of an external color may be, e.g., 65 or more. The external color may be mostly white, and confirmation with the naked eye or image recognition for the contamination caused by the abnormal discharge and the like in the semiconductor fabricating device may be facilitated. Accordingly, detection of the abnormal discharge and the like and cleaning of the member may be facilitated.

The $Y_5O_4F_7$ sintered body may include, e.g., greater than 0 mass % up to 10 mass % of a lanthanoid oxide, a lanthanoid fluoride, or a lanthanoid oxyfluoride. As used herein, the term "or" is not an exclusive term, e.g., "A or B" would include A, B, or A and B. In an implementation, a sinterability may be improved by adding a small amount of a so-called "adjuvant" and sintering the sintered body. Further, a microstructure of the sintered body may be controlled.

<Method of Fabricating Sintered Body>

Figure 2:
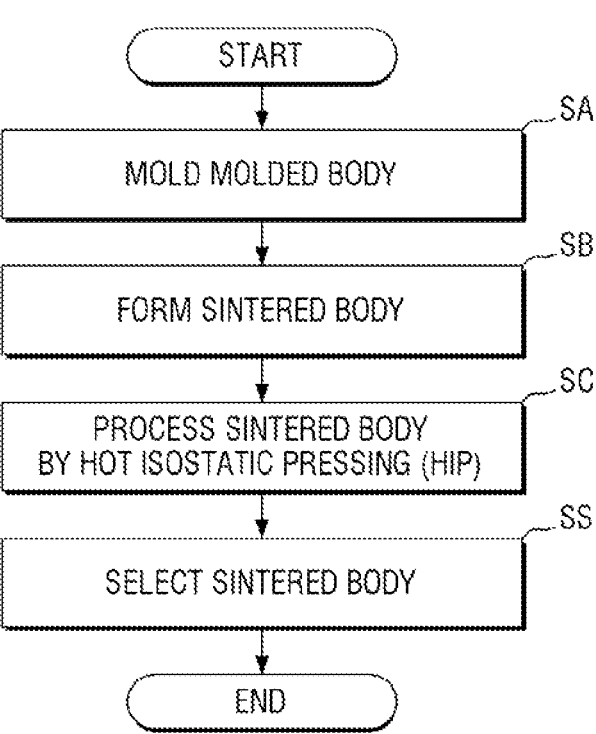
FIG. 2 is a flow chart of the method of fabricating the sintered body according to the first embodiment.

Next, the method of fabricating the sintered body of the present embodiment will be described. FIGS. 1 and 2 are flowcharts of the method of fabricating the sintered body according to the first embodiment. As shown in FIG. 1, the method of fabricating the sintered body according to the present embodiment may include a step SA of molding a molded body, a step SB of forming the sintered body, and a step SS of selecting the sintered body. In the step SA of molding the molded body, the molded body including $Y_5O_4F_7$ powder may be molded (e.g., the method may include forming a molded body including a $Y_5O_4F_7$ powder using a mold). In the step SB of forming the sintered body, the sintered body may be formed by sintering the molded body. In the step SS of selecting the sintered body, a desired sintered body may be selected from among all of the acquired sintered bodies (e.g., a portion of the acquired sintered bodies that exhibit desirable properties may be selected or isolated from the remaining sintered bodies or a composite sintered body). In an implementation, in the step SS of selecting the sintered body, a sintered body including 50 mass % or more of $Y_5O_4F_7$ may be selected, the relative density may be 97.0% or more, and the Vickers hardness may be 2.4 GPa or more.

In an implementation, as shown in FIG. 2, the method of fabricating the sintered body may include a step SC of processing the sintered body by a hot isostatic pressing (hereinafter, referred to as "HIP") between the step SB of forming the sintered body and the step SS of selecting the sintered body.

In the method of fabricating the sintered body of the present embodiment, the step SB of forming the sintered body may include a method using a pressureless sintering method or a method using a hot press method. Accordingly, hereinafter, I. Method of fabricating the sintered body using a pressureless sintering method, and II. Method of fabricating the sintered body using a hot press method are divided and described.

<I. Method of Fabricating Sintered Body Using Pressureless Sintering Method>

Figure 4:
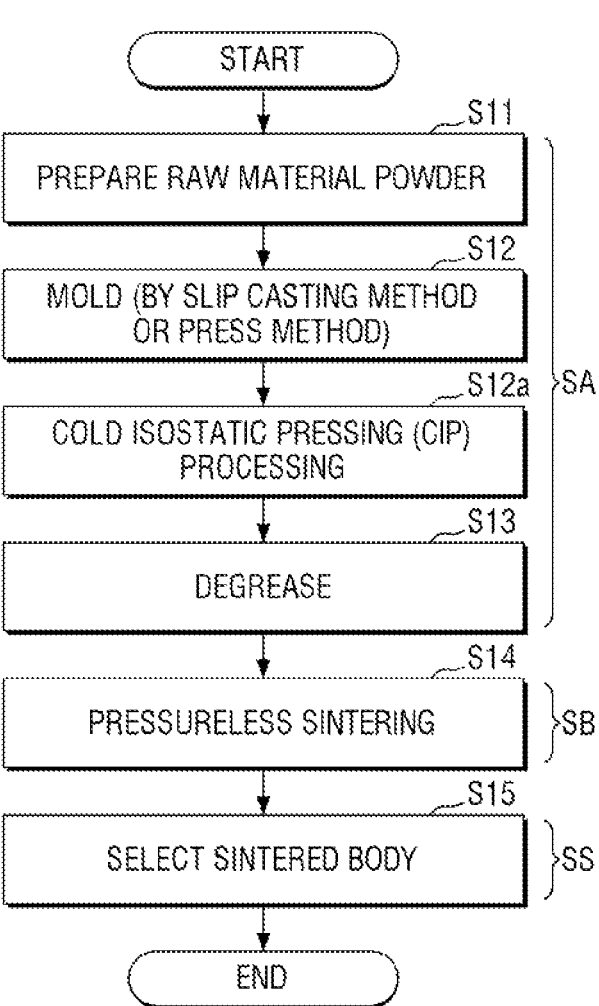
FIG. 4 is a flow chart of the method of fabricating the sintered body using the pressureless sintering method according to the first embodiment.

FIGS. 3 and 4 are flow charts of the method of fabricating the sintered body using the pressureless sintering method according to the first embodiment. As shown in FIG. 3, the method of fabricating the sintered body using the pressureless sintering method may include a step S11 of preparing raw material powder and a molding step S12 as the step SA of molding the molded body. A degreasing step S13 may be performed after the molding step S12. The step SB of forming the sintered body may include a pressureless sintering step S14. A step S15 may be included as the step SS of selecting the sintered body. In an implementation, as shown in FIG. 4, a cold isostatic pressing (hereinafter, referred to as "CIP") step S12a may be added after the molding step S12 as the molding step SA. Then, the degreasing step S13 or the pressureless sintering step S14 may be performed.

Hereinafter, I. Method of fabricating the sintered body using the pressureless sintering method will be described in order of 1. Prepare raw material powder (step S11), 2. Molding (step S12), 3. CIP (step S12a), 4. Degreasing (step S13), 5. Pressureless sintering (step S14).

<1. Prepare Raw Material Powder>

The raw material powder may be, e.g., $Y_5O_4F_7$ powder. As the raw material powder, three types of $Y_5O_4F_7$ powder, e.g., one having an average particle diameter of 0.5 μm (hereinafter, referred to as "raw material powder A"), one having an average particle diameter of 0.8 μm (hereinafter, referred to as "raw material powder B"), and one having an average particle diameter of 1.0 μm (hereinafter, referred to as "raw material powder C") may be used.

<2. Molding>

Next, as a method of molding the molded body, 2-1. Slip casting method and 2-2. Press method (uniaxial pressing method) will be described. In the method of fabricating the sintered body using the pressureless sintering method, in the step of molding the molded body, the molded body may be molded by the slip casting method or the uniaxial pressing method.

<2-1. Slip Casting Method>

The slip casting method is also called as an injection method. The slip casting method may include a slurry adjustment process and a slip casting molding process.

In the slurry adjustment process, e.g., 100 g of the raw material powder A, 50 g of ethanol as a solvent, 2 g of a dispersant, and 10 mL of a solution in which 2.3 g of a binder is dissolved in 50 mL of ethanol may be mixed in a glass container to adjust a slurry for the slip casting method. For the raw material powders B and C, the same slurry for the slip casting method may be adjusted.

In the slip casting molding process, the adjusted slurry may be poured into a silicone mold having a diameter of 13.5 mm and a depth of 20 mm on a gypsum board. Then, the slurry may be left for 4 days. After confirming that ethanol has been sufficiently dried by absorption or evaporation into the gypsum board, the slurry may be removed from the silicone mold. According to this, a molded body having a diameter of approximately 13.5 mm and a height of approximately 7 mm may be acquired.

<2-2. Press Method>

The press method may include an adjustment process of a powder for pressing and a press molding process.

In the adjustment process of the powder for pressing, e.g., 100 g of the raw material powder A, 25 g of pure water as a solvent, 0.3 g of a dispersant, and 4.4 mL of a solution in which a binder is dissolved in 12 mL of pure water may be mixed in a glass container to adjust a binder-added slurry used as a raw material for the powder for pressing. In an implementation, the pure water may be removed to acquire the powder for pressing by freezing and drying the adjusted slurry. For the raw material powders B and C, the same powder for pressing may be adjusted.

In the press molding process, 2.0 g of the acquired powder for pressing may be put into a cylindrical mold having a diameter of 10 mm, and a pressure of 8 MPa may be applied by a hydraulic press machine. Then, the powder for pressing may be removed from the mold to acquire a molded body, e.g., having a diameter approximately 10 mm and a height of approximately 8 mm.

<3. CIP>

The molded body acquired by the 2-1. Slip casting method and the 2-2. Press method may be processed by the CIP to further densify (e.g., increase density of) the molded body before sintering. In an implementation, the molded body may be pressurized for ten minutes at a pressure of 300 MPa using a CIP device after vacuum-packing.

<4. Degreasing>

In order to remove a binder component and a dispersant component included in the molded body, the molded body acquired by the 2-1. Slip casting method and the 2-2. Press method and additionally processed by the CIP may be heated and degreased under various conditions. During heating, e.g., the molded body may be on an alumina plate and heated. In an implementation, an atmosphere may be heated to a temperature of 400° C. in nitrogen gas (e.g., a flow rate is 0.2 L/min). 2-1. The molded body molded by the slip casting method may be heated, e.g., for 100 hours, and 2-2. The molded body molded by the press method may be heated, e.g., for 50 hours.

<5. Pressureless Sintering Method>

The degreased molded body may be put into, e.g., an alumina crucible, covered with a lid, and sintered under various conditions using an electric furnace. In the sintering conditions, an atmosphere may be argon (Ar) gas (flow rate is 2 L/min), nitrogen ($N_2$) gas (flow rate is 2 L/min), or a vacuum (approximately $10^{-3}$ Pa or less). A temperature increase rate may be set to 1,000° C./h, a holding temperature may be set to 900 to 1,400° C., a holding time may be set to 0 to 3 hours, and a temperature decrease rate is set to furnace cooling.

In an implementation, a peak from YOF other than the $Y_5O_4F_7$ powder may be detected according to an XRD analysis in an experiment of a sample in which $Y_5O_4F_7$ is sintered at 1,500° C., and thus the maximum holding temperature may be set to 1,400° C. In the case of sintering at 1,400° C., the peak from YOF was not observed, and thus F of $Y_5O_4F_7$ may be separated and an YOF phase may appear in the case of sintering at a high temperature, e.g., exceeding 1,400° C. As described above, $Y_5O_4F_7$ may have higher plasma resistance than YOF, and it may be undesirable to mix YOF with $Y_5O_4F_7$. In an experiment, the maximum holding temperature may be set to 1,400° C.

As shown in FIG. 2, in I. Method of fabricating the sintered body using the pressureless sintering method, the HIP may be additionally performed after 5. Pressureless sintering (step S14) in the step SB of forming the sintered body. According to this, the sintered body may be further densified.

<6. HIP>

The sintered body may be put into, e.g., an alumina crucible, covered with a lid, and at a pressure of 200 MPa under an argon atmosphere using a HIP device, a temperature increase rate of 1,000° C./h, a holding temperature of 900 to 1,100° C., and a holding time of 0 to 3 hours may be set.

<II. Method of Fabricating Sintered Body Using Hot Press Method>

Figure 5:
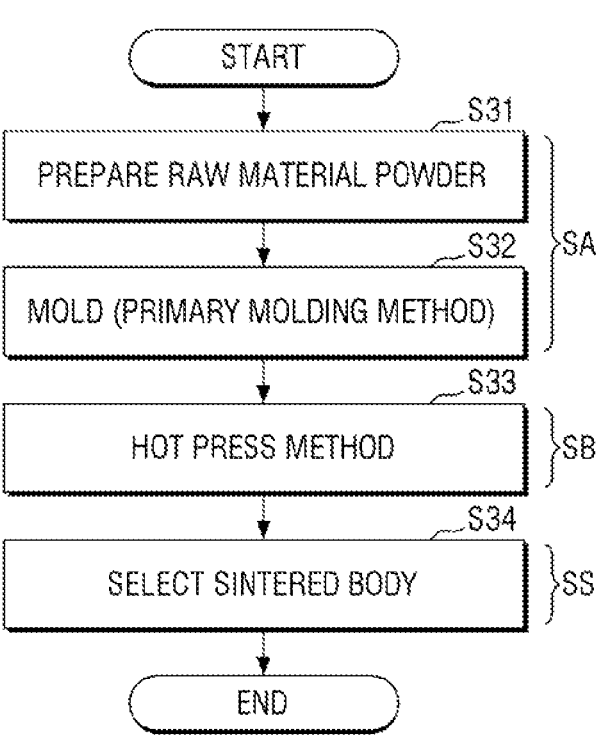
FIG. 5 is a flow chart of a method of fabricating the sintered body using a hot press method according to the first embodiment.

Next, the method of fabricating the sintered body using the hot press method will be described. FIG. 5 is a flow chart of the method of fabricating the sintered body using the hot press method according to the first embodiment. As shown in FIG. 5, the method of fabricating the sintered body using the hot press method may include a step S31 of preparing a raw material powder and a molding step S32 as the step SA of molding the molded body. A hot pressing step S33 may be included as the step SB of forming the sintered body. A step S34 may be included as the step SS of selecting the sintered body. Hereinafter, the method of fabricating the sintered body using the hot press method will be described in order of 1. Prepare the raw material powder (step S31), 2. Primary molding method (step S32), 3. Hot pressing (step S33). Meanwhile, as shown in FIG. 2, the HIP may be additionally performed after the hot pressing (step S33) of the step SB also in the method of fabricating the sintered body using the hot press method.

<1. Raw Material Powder>

The raw material powder may be $Y_5O_4F_7$ powder like the I. Method of fabricating the sintered body using the pressureless sintering method. As the raw material powder, three types of $Y_5O_4F_7$ powder, one having an average particle diameter of 0.5 μm (hereinafter, referred to as "raw material powder A"), one having an average particle diameter of 0.8 μm (hereinafter, referred to as "raw material powder B"), and one having an average particle diameter of 1.0 μm (hereinafter, referred to as "raw material powder C") may be used.

<2. Primary Molding Method>

In the primary molding method of the hot press, 100 g of the raw material powder A may be put into a square mold having a horizontal length of 50 mm and a vertical length of 50 mm. In an implementation, a pressure of, e.g., 18.4 MPa may be applied by a hydraulic press machine. In an implementation, in the step of molding the molded body, the molded body may be molded by the uniaxial pressing method. Then, the molded body may be removed from the mold to acquire a primary molded body having a horizontal length of approximately 50 mm and a vertical length of approximately 50 mm, and a height of approximately 12 mm. The primary molded body may be acquired in the same manner for the raw material powder C.

<3. Hot Pressing>

The primary molded body may be put into a carbon hot press mold of which a horizontal length and a vertical length are the same, and the hot pressing may be performed under various conditions. In the conditions of the hot pressing, an atmosphere may be argon gas (a flow rate is 1 L/min) or a vacuum (approximately $10^{-3}$ Pa or less).

Figure 6:
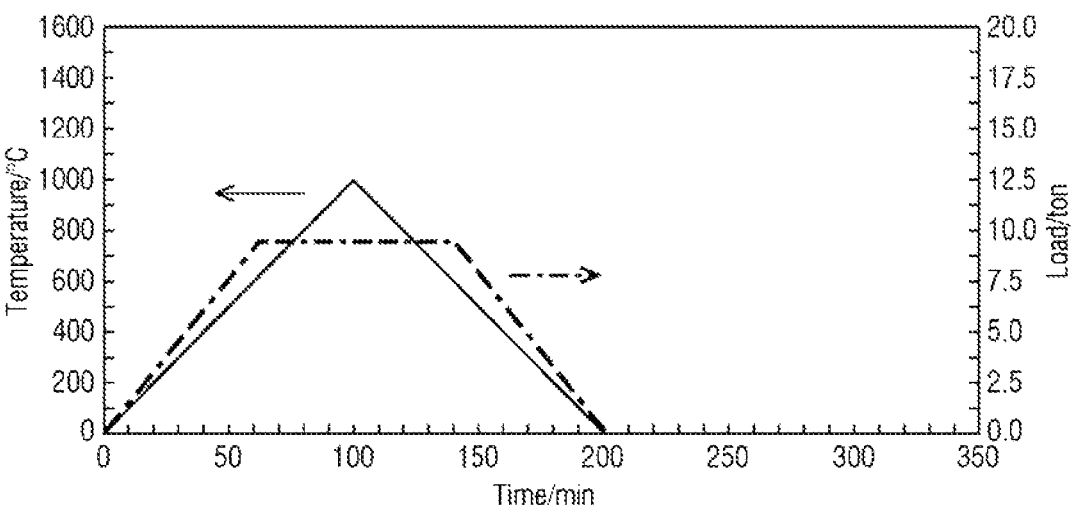
FIG. 6 is a graph of temperature and pressure profiles of a hot press in the method of fabricating the sintered body according to the first embodiment, wherein a horizontal axis indicates time and a vertical axis indicates temperature and pressure.

FIG. 6 is a graph showing temperature and pressure profiles of the hot press in the method of fabricating the sintered body according to the first embodiment, wherein a horizontal axis indicates time and a vertical axis indicates temperature and pressure.

As shown in FIG. 6, a temperature increase rate may be 10° C./min, a holding temperature may be 900 to 1,400° C., a holding time may be 0 to 1 hour, and a temperature decrease rate may be 10° C./min. A pressure may rise and reach the holding pressure in 1 hour as the temperature starts to rise. The holding pressure and the temperature may be set so that the end of the pressure reduction and the end of the temperature drop are simultaneously performed as the holding pressure becomes 36.7 MPa and the pressure reduction becomes 0 MPa in 1 hour. Meanwhile, for the same reason as described in 5. Pressureless sintering method in <I. Method of fabricating the sintered body using the pressure-less sintering method>, the maximum temperature of the holding temperature may be set to 1,400° C.

<Method of Evaluating Sintered Body>

Next, the method of evaluating the fabricated sintered body will be described. First, as the evaluation method, 1. Density, 2. Hardness (Vickers hardness), 3. Whiteness, 4. Composition analysis, and 5. Plasma resistance will be described.

<1. Density>

The density may be determined by the Archimedes method by weighing a weight in air and a weight in pure water of the acquired sintered body using an electronic balance. The determined density may be divided by a theoretical density of 5.14 g/cm$^3$ of $Y_5O_4F_7$ to calculate a relative density %.

In an implementation, if there were a void in a material used for a member for a semiconductor fabricating device, the portion could intensively corrode, and could become a cause of dust generation. In an implementation, the material used for the member for a semiconductor fabricating device may have a high relative density of, e.g., 97.0% or more, or 99.0% or more.

<2. Vickers Hardness>

The Vickers hardness may be measured, e.g., by a test force of 0.5 gf using a hardness tester.

<3. Whiteness>

In order to quantitatively evaluate the whiteness, L*, which is one of the Lab color space chromaticities, may be used as an index. Further, in order to minimize a change in chromaticity due to a state of a surface of the sintered body, such as surface roughness or the like, the L* may adopt a value measured by a specular component include (SCI) method. In an implementation, the L* of the surface of the sintered body may be measured using a colorimeter.

In an implementation, values of a* and b* in the Lab color space of the $Y_5O_4F_7$ sintered body produced in the present embodiment and Comparative Example may be within a range of approximately ±1 and ±5, respectively, and it may be seen that the external color was mostly achromatic (white to black).

In some members for a semiconductor fabricating device, the L* may be used as an index for quantitatively evaluating the whiteness (blackness). In some other methods, it is noted that contamination is not conspicuous and thus there is no need to perform excessive washing when the color of the member is black. However, this may not occur when an end point of cleaning is managed by a limiting sample, reflectance measurement, or the like when cleaning. On the contrary, when the contamination is difficult to be visually recognized, such quantitative management may be difficult, and as a result, cleaning may become insufficient, and thus there may be a concern about generation of particles and the like due to contamination. That is, the external color of the member for a semiconductor fabricating device may be white, a metallic luster, or transparent for easy recognition of the contamination.

For the external color of the member, e.g., when sensory evaluation was performed for the confirmation or observation of contamination with the naked eye by an operator of the device, when the L* is 60 to 70 or more, the contamination may be easily seen with the naked eye. In an implementation, when the L* is 65 or more, it may be considered that contamination is easily observed with the naked eyes.

In some other methods, the chromaticity L* after plasma exposure may be approximately 60, and the chromaticity L* of the contamination by plasma exposure may be approximately 60.

In the Lab color space, a color difference between two colors may be defined by the following equation.

$$\text{Color difference } \Delta E = (\Delta L^{*2} + \Delta a^{*2} + \Delta b^{*2})^{1/2}$$

As described above, the $Y_5O_4F_7$ sintered body may be mostly achromatic and may have small absolute values of a* and b*, the change may also be small, and the color difference ΔE may be mostly dominated by the change of L*.

Accordingly, there is no problem even when the equation is changed to the following equation.

$$\text{Color difference } \Delta E \approx \Delta L^*$$

For example, the color difference ΔE of 5.0 may be deemed to be substantially the same in the case of comparison over time. Conversely, when the color difference ΔE is 5.0 or more, it may be stated that a color change may be easily recognized in the case of comparison over time. It may be stated that contamination may be confirmed with the naked eye in a member having a color difference ΔE (≈ΔL*) of 5 or more, e.g., the L* of 65 or more compared to the chromaticity L*=60 of the contamination.

<4. Composition Analysis>

The fabricated $Y_5O_4F_7$ sintered body may be analyzed using an X-ray diffraction (XRD) device to confirm a composition.

<5. Plasma Resistance Test>

First, a surface condition of the sample may be smoothed. According to this, deviation of the surface state between samples may be constant. In smoothing, the surface of the sintered body may be polished using a #1000-4000 water-proof paper. The surface of the sintered body may be smoothed until an arithmetic surface roughness (Ra) is about 0.1 μm or less.

Next, in order to secure a region not exposed to plasma processing, approximately a half region of the surface of the $Y_5O_4F_7$ sintered body may be covered by attaching polyimide tape thereto. The sintered body to which the polyimide tape is adhered may go through the plasma resistance test with a $CF_4/O_2$ mixed gas in an etching device. In an implementation, an electrode size may be set to a diameter of 100 mm, a pressure may be set to 20 Pa, RF power may be set to 150 W, a gas flow rate of $CF_4$ may be set to 40 mL/min, and a gas flow rate of $O_2$ may be set to 10 mL/min, and the plasma processing may be performed for two hours. After the plasma processing, the sintered body may be taken out and the polyimide tape is peeled off.

A level difference at a boundary portion near a cross-section of the polyimide tape may be measured using a surface shape measuring device, and the level difference may be used as the etching amount. Further, the arithmetic surface roughness (Ra) of the surface of the sintered body may be measured before and after the plasma resistance test using the surface shape measuring device for a portion not covered with the polyimide tape. A deterioration rate of the arithmetic surface roughness Ra is found by the following equation.

$$(Ra \text{ deterioration rate})=(Ra \text{ after plasma resistance} \\ test)/(Ra \text{ before plasma resistance test})$$

It may be said that damage to the surface due to plasma exposure is smaller as the Ra deterioration rate is smaller.

<Evaluation Result>

Next, the evaluation result will be described. The evaluation result will be described by dividing the sintered body by the pressureless sintering method, the sintered body by the hot pressing method, and the sintered body by the pressureless sintering method and the HIP. First, the evaluation result of the sintered body by the pressureless sintering method will be described.

<Evaluation Result of Sintered Body by Pressureless Sintering Method>

FIGS. 7A and 7B are tables of an evaluation result of the sintered body by the pressureless sintering method according to the first embodiment;

In FIGS. 7A and 7B, conditions of the step SA of molding the molded body and the step SB of forming the sintered body are shown as the fabricating method. For example, in Example 1 in FIG. 7A, the conditions of step SA of molding the molded body used the raw material powder A as a raw material powder, and the molded body was molded using the slip casting method. Further, the CIP was performed on the molded body. In addition, in the conditions of the step SB of forming the sintered body, the temperature increase rate was 1,000° C./h under an argon atmosphere, and the holding temperature was set to 1,000° C., and the holding time was set to one hour to form the sintered body. As the evaluation result, the relative density was 97.2%, the hardness was 3.9 GPa, and the whiteness L* was 81.31. Overall judgment was ⊚.

Here, a case in which the overall judgment is ⊚ indicates that the density was 97.0% or more, the hardness was 2.4 GPa or more, and the whiteness L* was 65 or more. A case in which the overall judgment is ○ indicates that the density was 97.0% or more, the hardness was 2.4 GPa or more, and the whiteness L* was less than 65. A case in which the overall judgment is "x" indicates that the density was less than 97.0% or the hardness was less than 2.4 GPa.

As shown in FIGS. 7A and 7B, a $Y_5O_4F_7$ sintered body having a relative density of 97.0% or more and a Vickers hardness of 2.4 GPa or more may be acquired by sintering the molded body at a temperature of 1,000° C. or more under the argon gas atmosphere or a vacuum atmosphere of $10^{-3}$ Pa or less. For example, in the step SB of forming the sintered body, the $Y_5O_4F_7$ sintered body may be formed by the pressureless sintering method at 1,000° C. or more to 1,400° C. or less. As the relative density increases, the whiteness L* tends to increase.

Figure 8:
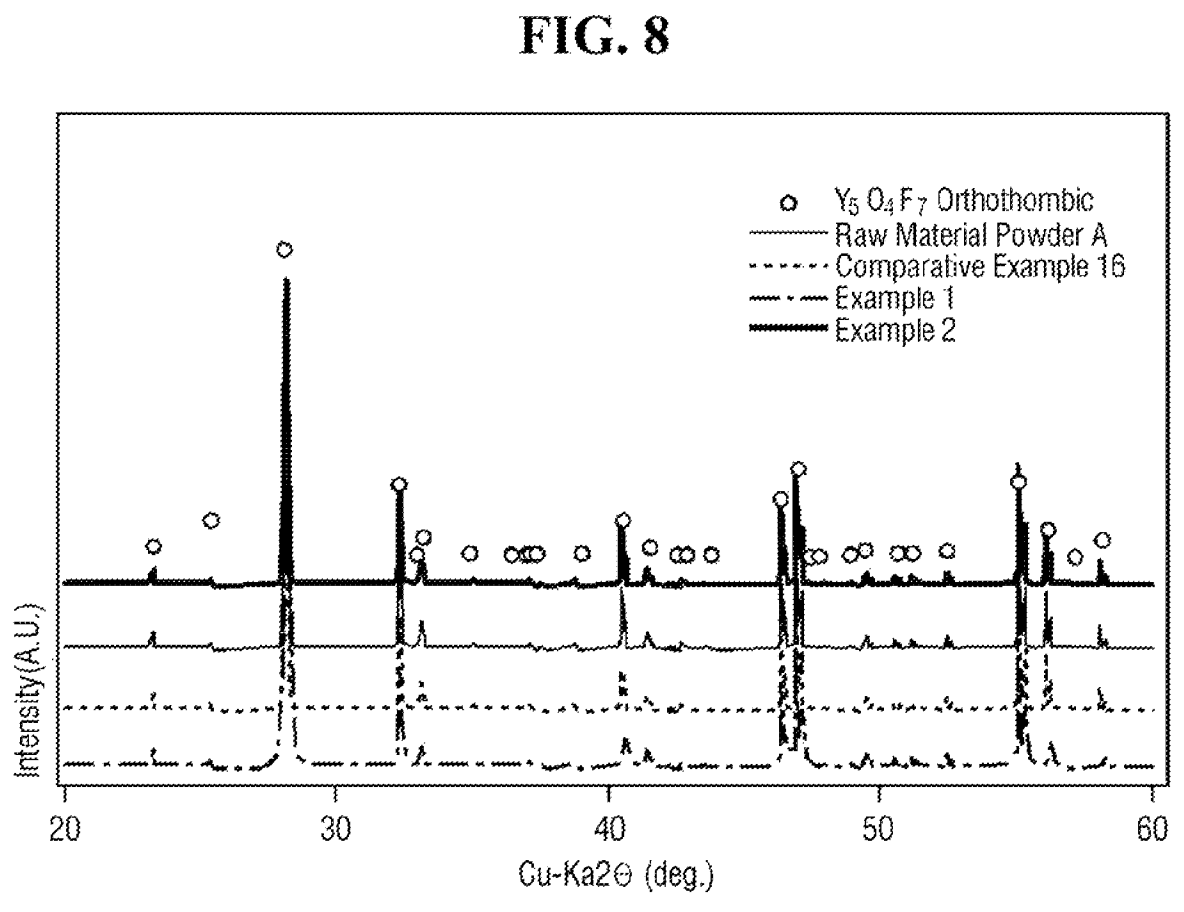

FIG. 8 is an XRD spectrum of the sintered body prepared by the pressureless sintering method according to the first embodiment. FIG. 8 further illustrates an XRD spectrum of the raw material powder A in addition to Examples 1 and 2 and Comparative Example 16. As shown in FIG. 8, it may be seen that the raw material powder A included almost no impurities. Meanwhile, XRD analysis results of the raw material powders B and C are the same as that of the raw material powder A.

Further, the $Y_5O_4F_7$ sintered body fabricated using the raw material powder A also hardly showed an impurity peak, and the $Y_5O_4F_7$ sintered body was substantially composed of only $Y_5O_4F_7$. That is, the $Y_5O_4F_7$ sintered body included 99 mass % or more of $Y_5O_4F_7$. Further, the same XRD analysis result may be acquired for a $Y_5O_4F_7$ sintered body according to another Example.

As described above, according to the present embodiment, a $Y_5O_4F_7$ sintered body having a relative density of 97.0% or more and a Vickers hardness of 2.4 GPa or more may be formed. In an implementation, a $Y_5O_4F_7$ sintered body including 99 mass % or more of $Y_5O_4F_7$, and having a relative density of 97.0 to 99.3% and a Vickers hardness of 2.4 to 4.4 GPa, may be formed.

Such a $Y_5O_4F_7$ sintered body may help improve the plasma resistance with both the high density and the high hardness which may be compatible. In an implementation, the $Y_5O_4F_7$ sintered body may be fabricated using the pressureless sintering method having a high degree of freedom in shape. In an implementation, when the slip casting method, which is a molding method, is used for molding, a degree of freedom in shape may be very high, and production costs due to a so-called near net shape may be reduced. A sample having a relative density of 99.0% or more and a whiteness L* of 65 or more, which is a more preferable $Y_5O_4F_7$ sintered body, may not be acquired in a range of other (e.g., comparative) fabricating conditions in FIG. 7.

<Evaluation Result of Sintered Body by Hot Press Method>

FIG. 9 is a table showing fabricating conditions and an evaluation result of the sintered body prepared by the hot press method according to the first embodiment. In FIG. 9, the conditions of the step SA of molding the molded body and the step SB of forming the sintered body are shown as the fabricating conditions. For example, in Example 14 in FIG. 9, the raw material powder A was used as a raw material powder, and the holding temperature was set to 1,000° C., and the holding time was set to one hour to form the sintered body under the argon atmosphere. As the evaluation result, the relative density was 100%, the Vickers hardness was 2.4 GPa, and the whiteness L* was 40.32. Overall judgment was ○. Meanwhile, meanings of ⊚, ○, and x are the same as above.

As shown in FIG. 9, when the holding temperature is 900° C. or more and the holding time was one hour, or when the holding temperature was 1,000° C. or more, and there was no holding time, a $Y_5O_4F_7$ sintered body having a relative density of 97% or more and a Vickers hardness of 2.4 GPa or more may be acquired. In an implementation, in the step SB of forming the sintered body, a $Y_5O_4F_7$ sintered body may be formed by the hot pressing of 900° C. or more to 1,400° C. or less.

Figure 10:
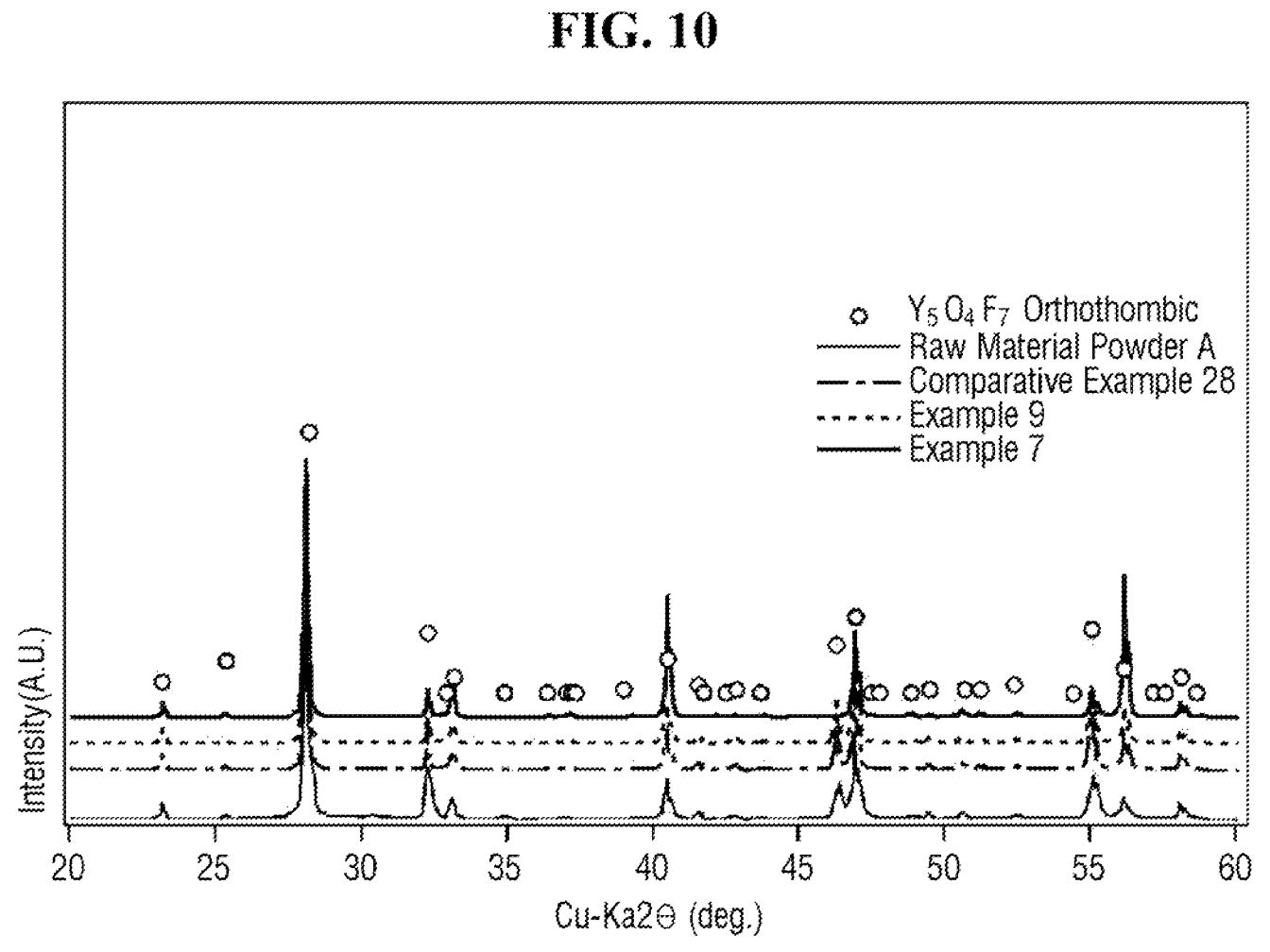

FIG. 10 is an XRD spectrum of the sintered body prepared by the hot press method according to the first embodiment. FIG. 10 illustrates an XRD spectrum of the raw material powder A, in addition to Examples 7 and 9 and Comparative Example 28. As shown in FIG. 10, it may be seen that the raw material powder A included almost no impurities. An XRD spectrum of the raw material powders B and C are the same as that of the raw material powder A.

Further, a sintered body also hardly shows an impurity peak, and the sintered body according to the present embodiment may be substantially composed of only $Y_5O_4F_7$. The same XRD spectrum may be acquired for the $Y_5O_4F_7$ sintered body according to another Example. A sample having a relative density of 97.0% or more and a whiteness L* of 65 or more may not be acquired in a range of other (e.g., comparative) fabricating conditions in FIG. 9.

<Evaluation Result of Sintered Body by Pressureless Sintering Method and HIP>

FIG. 11 is a table of fabricating conditions and evaluation results of a sintered body obtained by further performing hot isostatic pressing (HIP) on the sintered body by the pressureless sintering method according to the first embodiment. FIG. 11 illustrates fabricating conditions and an evaluation result of the sintered body before the HIP, HIP conditions, and an evaluation result after the HIP. In Example 25 in FIG. 11, the sintered body of Example 1 was used as the sintered body before the HIP. Overall judgment at this point is J⊙.

Here, the overall judgment of the sintered body before the HIP is J⊙, which indicates that the density was 94.0% or more and the whiteness L* was 75 or more. The overall judgment J• indicates that the density was 94.0% or more and the whiteness L* was less than 75. The overall judgment J○ indicates that the density was 90.0% or more and less than 94.0%. The overall judgment Jx indicates that the density was less than 90.0%.

For example, in Example 25, in the HIP, the holding temperature was 1,100° C. and the holding time was three hours. As the evaluation result, the relative density was 99.5%, the Vickers hardness was 2.9 GPa, and the whiteness L* was 67.27. The overall judgment is ⊙. Meanwhile, meanings of the overall judgment ⊙, ○, and x are the same as those in <Evaluation result of the sintered body by the pressureless sintering method> and <Evaluation result of the sintered body by the hot press method>.

As shown in FIG. 11, when a sintered body having a relative density of 90% or more was subjected to the HIP at 1,000° C. or more for 0 to 3 hours, a $Y_5O_4F_7$ sintered body having a relative density of 97% or more and a Vickers hardness of 2.4 GPa or more may be acquired. Further, when a sintered body having a density of 94.0% or more and an L* of 75 or more is subjected to the HIP under the above-described conditions, a $Y_5O_4F_7$ sintered body having a relative density of 97.0% or more, a Vickers hardness of 2.4 GPa or more, and an L* of 65 or more may be acquired.

Like the above, the $Y_5O_4F_7$ sintered body of the present embodiment may also be acquired by performing the HIP of isotropically pressurizing the sintered body which is sintered without pressure, and a degree of freedom in shape may be improved compared to the hot pressing method of uniaxial pressurization and sintering.

Figure 12:
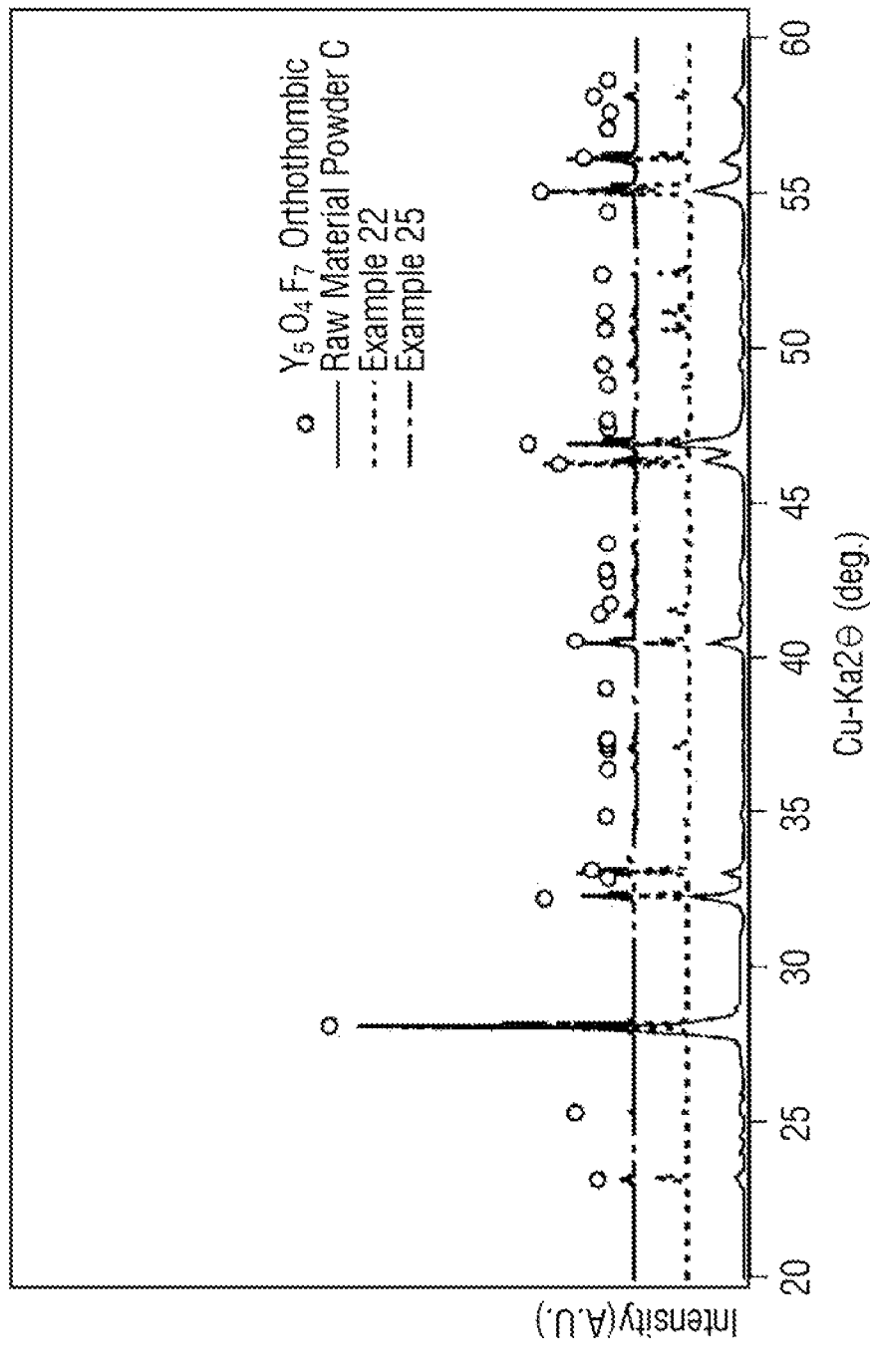
FIG. 12 is an XRD analysis result of the sintered body obtained by further performing HIP processing on the sintered body by the pressureless sintering method according to the first embodiment.

FIG. 12 is an XRD spectrum of a sintered body obtained by further performing hot isostatic pressing (HIP) on the sintered body by the pressureless sintering method according to the first embodiment. FIG. 12 illustrates the XRD spectrum of the raw material powder C in addition to Examples 22 and 25. As shown in FIG. 12, it may be seen that the raw material powder C included almost no impurities.

Further, a sintered body also hardly showed an impurity peak, and the sintered body according to the present embodiment was substantially composed of only $Y_5O_4F_7$. Further, the same XRD analysis result may be acquired for the $Y_5O_4F_7$ sintered body according to another Example.

In the sintered body before the HIP, the relative density may be 90% or more. In an implementation, in the sintered body before the HIP, the relative density may be 94.0% or more and the whiteness L* may be 75 or more. Accordingly, conditions preferable for the sintered body before the HIP processing will be considered later.

FIGS. 13A and 13B are tables of fabricating conditions and evaluation results with a changed determination criterion in the sintered body by the pressureless sintering method according to the first embodiment. As shown in FIGS. 13A and 13B, when the holding temperature was 900° C. or more and the holding time was one hour, a sintered body having a relative density of 90% or more may be acquired. Further, when the holding temperature was 1,000° C. or more and the holding time was one hour, a sintered body having a relative density of 94% or more and a whiteness L* of 75 or more may be acquired.

FIG. 14 is a table of fabricating conditions and evaluation results with a changed determination criterion in the sintered body by the hot press method according to the first embodiment. As shown in FIG. 14, when the holding temperature was 900 to 1,400° C. and the holding time was 0 to one hour, a sintered body having a relative density of 90% or more may be acquired. Further, under the argon atmosphere, when the holding temperature was 1,000° C. or more and the holding time was 0, a sintered body having a relative density of 94% or more and a whiteness L* of 75 or more may be acquired.

FIG. 15 is a table of the fabricating conditions and a plasma resistance test result of the sintered body according to the first embodiment. FIG. 15 illustrates the same plasma resistance test result for a commercially available $Y_2O_3$ sintered body for comparison (Comparative Example 36). As shown in FIG. 15, the sintered bodies of Examples 1, 23, and 34 each had an etching amount smaller than or equal to that of the $Y_2O_3$ sintered body, and a small change in surface roughness. Accordingly, the $Y_5O_4F_7$ sintered body according to the present embodiment had higher plasma resistance compared to the $Y_2O_3$ sintered body, and specifically, may be superior in terms of a reduction of a dust generation amount which is most important.

The sintered body according to Example 23 has a small or low whiteness L* and thus it was considered that contamination would be difficult to visually recognize, but the plasma resistance thereof was not inferior to that of the sintered body having a large whiteness L*. For example, a value of the whiteness L* may affect the visibility of the contamination, and the value of the whiteness L* may have little effect on plasma resistance, which is important as a member for the semiconductor fabricating device.

When Example 1 and Comparative Example 18 are compared, Example 1 was small in both etching amount and Ra deterioration rate, and had favorable plasma resistance. Hardness of both were almost the same, and there was a difference in relative densities.

Considering that the value of the whiteness L* had little effect on plasma resistance, a cause of low plasma resistance of Comparative Example 18 may be a small relative density. That is, when the relative density was less than 97%, corrosion proceeded in the void and thus plasma resistance deteriorated. In an implementation, the relative density may be 97% or more.

When Example 23 and Comparative Example 27 are compared, Example 23 was small in both etching amount and Ra deterioration rate, and had favorable plasma resistance. Relative densities of both were almost the same, and there was a difference in hardness. The value of the whiteness L* had little effect on plasma resistance, and a cause of low plasma resistance of Comparative Example 27 may be a small hardness. When the hardness is less than 2.4 GPa, physical etching proceeds and thus plasma resistance may deteriorate. In an implementation, the hardness may be 2.4 GPa or more.

<Adjuvant>

Next, an adjuvant will be described. Generally, in fabrication of ceramics, an additive in addition to a base material, e.g., an adjuvant, may be added in a small amount of, e.g., up to 10 mass %, for sintering.

According to this, the sinterability may be improved or the microstructure of the sintered body may be controlled. A method of reducing a particle diameter to improve an optical characteristic may include adding rare earth elements and controlling a microstructure of SiAlON ceramics.

The sintered body of the present embodiment may also be fabricated by sintering using the adjuvant. A case in which this adjuvant is included may also be defined as "substantially composed of $Y_5O_4F_7$". The plasma resistance may be further improved by controlling the microstructure using the adjuvant. In an implementation, plasma resistance of a grain boundary region may be improved by dispersing the adjuvant in the grain boundary region having low plasma resistance. Further, it is also possible to control the particle diameter and reduce dust generation. When the particle diameter is increased, a proportion of the grain boundary region having the low plasma resistance may become small, and an etching rate may become small. Conversely, when the particle diameter is reduced, a size of a generated particle may be reduced.

In the sintered body of the present embodiment, the material used as the adjuvant may have high plasma resistance like $Y_5O_4F_7$. In an implementation, rare earth elements, e.g., lanthanoid elements (La, Ce, Pr, Nd, Pm, Sm, Eu, Gd, Tb, Dy, Ho, Er, Tm, Yb, Lu) may have a relatively low vapor pressure in a compound with a halogen compared to other elements, and thus may have excellent plasma resistance. Oxides, fluorides, and oxyfluorides, which are compounds in which these elements are stable, may be used as the adjuvants to be added in the present disclosure.

Second Embodiment

Figure 16:
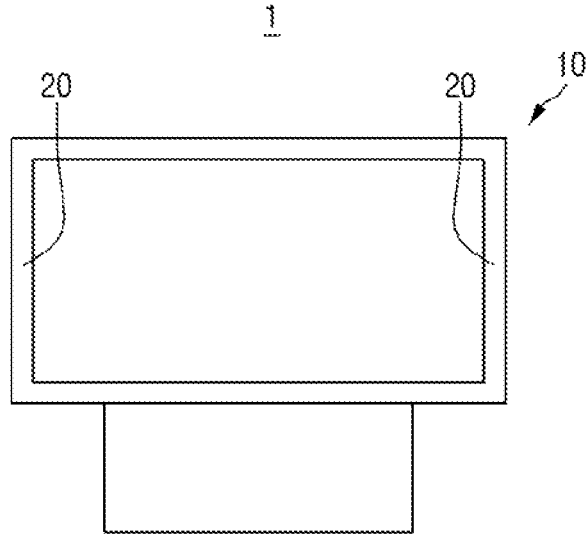
FIG. 16 is a diagram of a semiconductor fabricating device according to a second embodiment.

Next, a semiconductor fabricating device and a method of fabricating the semiconductor fabricating device according to the second embodiment will be described. The semiconductor fabricating device of the present embodiment may include the sintered body of the first embodiment. FIG. 16 is a diagram of the semiconductor fabricating device according to the second embodiment. As shown in FIG. 16, a semiconductor fabricating device 1 of the present embodiment may include, e.g., a chamber 10. In an implementation, the semiconductor fabricating device 1 may be, e.g., an etching device, or may be another semiconductor fabricating device such as a chemical vapor deposition device. An inner wall of the chamber 10 or a member usable in the chamber may include a sintered body 20. The sintered body 20 may be, e.g., the $Y_5O_4F_7$ sintered body disclosed in the first embodiment.

Figure 17:
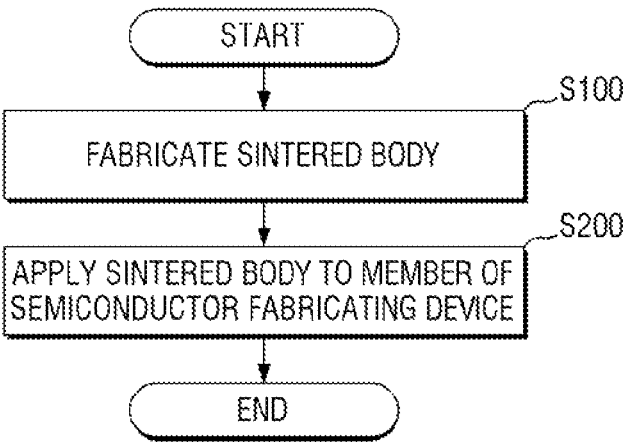
FIG. 17 is a flow chart of a method of fabricating the semiconductor fabricating device according to the second embodiment.

FIG. 17 is a flow chart of the method of fabricating the semiconductor fabricating device according to the second embodiment. As shown in FIG. 17, the method of fabricating the semiconductor fabricating device may include a step of fabricating a sintered body (step S100), and a step of applying the sintered body to the member of the semiconductor fabricating device (step S200). Here, the step S100 of fabricating the sintered body includes the step SA of molding the molded body in FIG. 1 or FIG. 2 of the first embodiment, which is described above, the step SB of forming the sintered body, (the step SC of processing the sintered body by HIP), and the step SS of selecting the sintered body. In the step SS of selecting the sintered body, a desired sintered body may be selected from among (e.g., isolated from) all of the acquired sintered bodies. In an implementation, a sintered body including 50 mass % or more of $Y_5O_4F_7$, and having a relative density of 97.0% or more, and a Vickers hardness of 2.4 GPa or more may be selected. In an implementation, in the step SS of selecting the sintered body, a sintered body having a relative density of 99.0% may be selected, and a sintered body having a whiteness L* in the Lab color space of the external color of 65 or more may be selected. In an implementation, a sintered body may be selected from among the sintered bodies processed by HIP In the step S200 of applying the sintered body to the member of the semiconductor fabricating device, after the step SS of selecting the sintered body in the method of fabricating the sintered body, the selected sintered body may be applied to the member of the semiconductor fabricating device 1. In an implementation, the selected sintered body may be applied to a member of the inner wall of the chamber 10 or the like, or a member of a component used in the chamber.

The semiconductor fabricating device 1 of the present embodiment may include the $Y_5O_4F_7$ sintered body in the member of the inner wall of the chamber 10, or the like, and corrosion resistance of the semiconductor fabricating device 1, e.g., plasma resistance, may be improved. Other configurations and effects may be included in the disclosure of the first embodiment.

By way of summation and review, the influence of particles due to dust generation in a semiconductor fabricating device, e.g., a plasma etching device, may be a concern. The particles may be generated when a halogen-based etching gas corrodes an inner wall or internal components of a chamber. Accordingly, a member used in the semiconductor fabricating device may exhibit corrosion resistance.

Alumina may be used as a corrosion-resistant material. Yttrium oxide (e.g., $Y_2O_3$ or the like) may exhibit better corrosion resistance and may be commercialized.

A deteriorated layer could occur due to fluorination is formed on a surface of $Y_2O_3$ when $Y_2O_3$ is exposed to fluorine-based plasma. Meanwhile, in an oxyfluoride of yttrium, e.g., $Y_5O_4F_7$ or YOF, the deteriorated layer may not be formed, and thus the oxyfluoride of yttrium may be a corrosion-resistant material. $Y_5O_4F_7$ may have less of a change in surface roughness before and after etching with a halogen-based gas compared to $Y_2O_3$ or YOF. Accordingly, it is considered that in $Y_5O_4F_7$, the size thereof is small as the amount of generated particles is small, and thus $Y_5O_4F_7$ may be superior to $Y_2O_3$ and YOF.

Hardness may also be important for a member for a semiconductor fabricating device. If the hardness were to be too low, a surface could easily damaged during assembly or maintenance of a device. When damage is exposed to plasma, defects such as a cause of generation of the particles (which generate abnormal discharge) and the like could occur.

$Y_2O_3$ by an AD method with a larger Vickers hardness may have high plasma resistance compared to $Y_2O_3$ by other fabricating methods. It is thought that this result comes from an increase in resistance of an etching gas against a physical action when a hardness is large. That is, even when materials have the same chemical composition, the material having a higher hardness, may have higher plasma resistance, and sputter resistance due to an ion impact is concerning.

When $Y_5O_4F_7$ of high hardness can be fabricated, it is thought that a member for a semiconductor fabricating device with high plasma resistance and a small dust generation amount may be acquired.

One or more embodiments may provide a sintered body, a method of fabricating the sintered body, a semiconductor fabricating device, and a method of fabricating the semiconductor fabricating device.

A sintered body capable of improving corrosion resistance, a method of fabricating the sintered body, a semiconductor fabricating device, and a method of fabricating the semiconductor fabricating device according to the present disclosure can be provided.

One or more embodiments may provide an yttrium oxyfluoride ($Y_5O_4F_7$) material for a member that is in contact with plasma or a radical including a halogen gas in an etching device, and a chemical vapor growth device used in a semiconductor fabricating process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a sintered body, the method comprising:

molding a molded body including a $Y_5O_4F_7$ powder;

forming a composite sintered body by sintering the molded body at a temperature of 1,000° C. or higher under an argon gas atmosphere or a vacuum atmosphere of $10^{-3}$ Pa or less; and selecting a sintered body from the composite sintered body, wherein the selected sintered body includes 50 mass % or more of $Y_5O_4F_7$, has a relative density of 97.0% or more, and has a Vickers hardness of 2.4 GPa or more;

wherein the selected sintered body has a whiteness L* in a Lab color space of an external color of 65 or more.

2. The method as claimed in claim 1, wherein molding the molded body includes performing slip casting or uniaxial pressing.

3. The method as claimed in claim 2, wherein forming the composite sintered body includes performing pressureless sintering at 1,000° C. to 1,400° C.

4. The method as claimed in claim 3, further comprising processing the composite sintered body by performing hot isostatic pressing (HIP) after forming the composite sintered body to form a HIP composite sintered body, wherein selecting the sintered body includes selecting the sintered body from the HIP composite sintered body.

5. The method as claimed in claim 4, wherein a relative density of the composite sintered body before performing the HIP is 90% or more.

6. The method as claimed in claim 4, wherein, in the composite sintered body before performing the HIP:

the relative density is 94% or more; and a whiteness L* in a Lab color space of an external color is 75 or more.

7. The method as claimed in claim 1, wherein:

molding the molded body includes performing uniaxial pressing; and forming the composite sintered body includes performing a hot press at 1,000° C. to 1,400° C.

8. The method as claimed in claim 7, wherein the sintered body has a relative density of 99.0%.

9. The method as claimed in claim 1, wherein the sintered body includes 99 mass % or more of $Y_5O_4F_7$.

10. The method as claimed in claim 1, wherein selecting the sintered body from the composite sintered body includes isolating the sintered body from the composite sintered body.

11. The method as claimed in claim 1, wherein the molded body further includes an adjuvant.

12. The method as claimed in claim 11, wherein the adjuvant includes a lanthanoid oxide, a lanthanoid fluoride, or a lanthanoid oxyfluoride.

* * * * *